United States Patent

Duan et al.

(10) Patent No.: US 10,965,283 B2
(45) Date of Patent: Mar. 30, 2021

(54) FLOATING SWITCH AND DRIVE CIRCUIT THEREOF

(71) Applicant: Silergy Semiconductor Technology (Hangzhou) LTD, Hangzhou (CN)

(72) Inventors: Xiaoming Duan, Fremont, CA (US); Jun Chen, Hangzhou (CN)

(73) Assignee: Silergy Semiconductor Technology (Hangzhou) LTD, Hangzhou (CN)

(*) Notice: Subject to any disclaimer, the term of this patent is extended or adjusted under 35 U.S.C. 154(b) by 0 days.

(21) Appl. No.: 16/658,279

(22) Filed: Oct. 21, 2019

(65) Prior Publication Data

US 2020/0136610 A1  Apr. 30, 2020

(30) Foreign Application Priority Data

Oct. 31, 2018  (CN) .......................... 201811290979.5

(51) Int. Cl.
*H03K 17/687* (2006.01)
(52) U.S. Cl.
CPC .................................. *H03K 17/687* (2013.01)
(58) Field of Classification Search
None
See application file for complete search history.

(56) References Cited

U.S. PATENT DOCUMENTS

| 5,731,732 | A | * | 3/1998 | Williams | H03K 17/687 |
|---|---|---|---|---|---|
| | | | | | 327/434 |
| 7,724,034 | B2 | * | 5/2010 | Tsu | H03K 17/6871 |
| | | | | | 326/82 |
| 7,994,725 | B2 | | 8/2011 | Bouchard | |
| 8,054,054 | B2 | * | 11/2011 | Lee | H02M 3/07 |
| | | | | | 323/271 |
| 8,339,063 | B2 | | 12/2012 | Yan et al. | |
| 9,543,841 | B2 | * | 1/2017 | Boulharts | H03K 17/102 |
| 9,685,857 | B2 | * | 6/2017 | Barauna | H02M 5/458 |
| 9,787,295 | B2 | | 10/2017 | Won et al. | |
| 2013/0002159 | A1 | | 1/2013 | Chen et al. | |
| 2014/0055168 | A1 | | 2/2014 | Deng et al. | |
| 2014/0056047 | A1 | | 2/2014 | Kuo | |
| 2014/0062322 | A1 | | 3/2014 | Yu et al. | |
| 2018/0013422 | A1 | * | 1/2018 | Leong | H03K 17/063 |

\* cited by examiner

*Primary Examiner* — Lincoln D Donovan
*Assistant Examiner* — Khareem E Almo
(74) *Attorney, Agent, or Firm* — Michael C. Stephens, Jr.

(57) ABSTRACT

An apparatus can include: a drive circuit for a floating switch having first and second transistors coupled in series, where gate terminals of the first and second transistors are coupled together, and source terminals of the first and second transistors are coupled together; a control circuit coupled to the gate terminals of the first and second transistors, and being configured to control on and off states of the first and second transistors; and a clamp circuit configured to clamp gate-source voltages of the first and second transistors to maintain current switching states of the first and second transistors.

15 Claims, 7 Drawing Sheets

FLOATING SWITCH AND DRIVE CIRCUIT THEREOF

RELATED APPLICATIONS

This application claims the benefit of Chinese Patent Application No. 201811290979.5, filed on Oct. 31, 2018, which is incorporated herein by reference in its entirety.

FIELD OF THE INVENTION

The present invention generally relates to the field of power electronics, and more particularly to floating switches and associated drive circuitry.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. Switching power supplies have a wide variety of applications in modern electronics. For example, switching power supplies can be used to drive light-emitting diode (LED) loads.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

In analog integrated circuits, floating switches are widely used in high-voltage digital-to-analog converters, high-voltage multiplexers, high-voltage amplifiers with adjustable gains, and the like. The driving signal of the floating switch can be generated by a driving circuit and a level shifter. When the floating switch is turned on, current may flow from the driving circuit to the node of the floating switch, which can affect the accuracy of the node of the floating switch.

Figure 1:
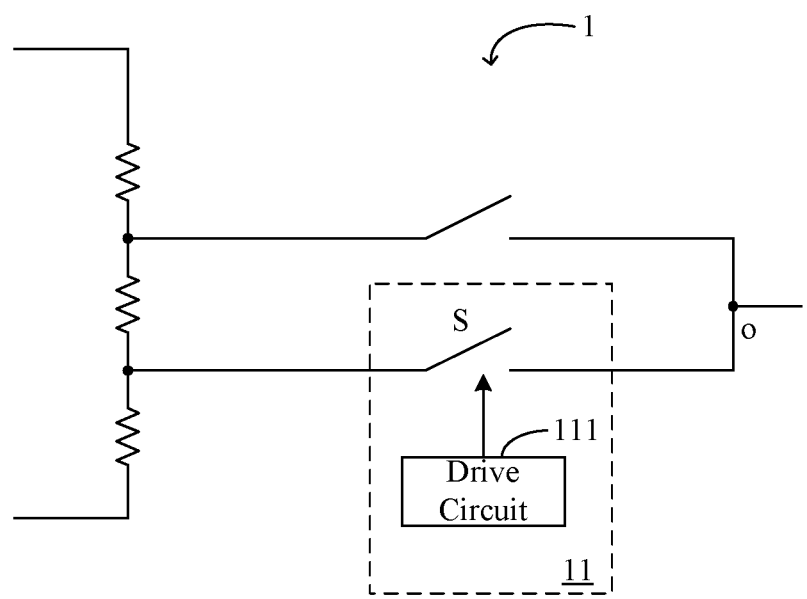
FIG. 1 is a schematic block diagram of an example high voltage multiplexer with a floating switch.

Referring now to FIG. 1, shown is a schematic block diagram of an example high voltage multiplexer with a floating switch. In this example, high voltage multiplexer 1 can include floating switch 11, and floating switch 11 can include switch S and drive circuit 111. Drive circuit 111 can control the on and off states of switch S to obtain different output voltages at output terminal "o." Since the voltage at both ends of switch S varies, it is expected that switch S exhibits the characteristics of an ideal switch; that is, switch S itself may not exert any influence on the voltage at both ends of switch S, which can be important in applications that require higher accuracy.

Figure 2:
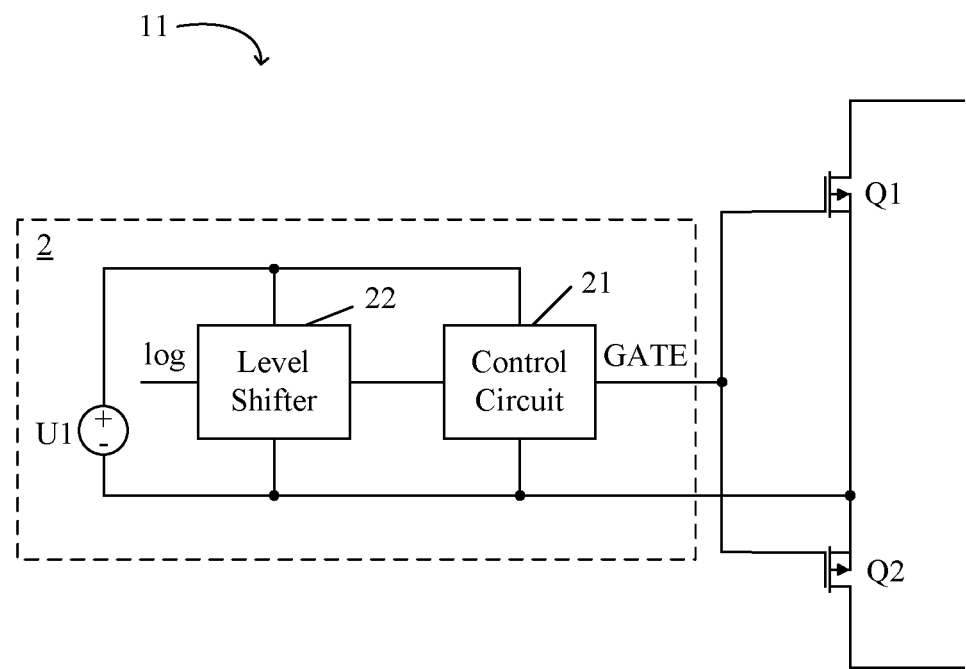
FIG. 2 is a schematic block diagram of an example floating switch.

Referring now to FIG. 2, shown is a schematic block diagram of an example floating switch. In this particular example, floating switch 11 can include drive circuit 2 and transistors Q1 and Q2. Gate terminals of transistors Q1 and Q2 can be commonly connected with each other and source terminals of transistors Q1 and Q2 may be commonly connected with each other. Drive circuit 2 can include voltage source U1, control circuit 21, and level shifter 22. Also, the source terminals of transistors Q1 and Q2 can be connected to one end of voltage source U1 (e.g., a negative electrode of voltage source U1). Control circuit 21 can connect to the gate terminals of transistors Q1 and Q2 for controlling the on and off states of transistors Q1 and Q2.

Level shifter 22 can convert the level of logic signal log to drive control circuit 21 to generate drive signal GATE for transistors Q1 and Q2. Voltage source U1 can supply power for control circuit 21 and level shifter 22. Since the source terminals of transistors Q1 and Q2 are connected to voltage source U1, when transistors Q1 and Q2 are turned on, a current may flow from drive circuit 2 to the source terminals of transistors Q1 and Q2, thereby affecting the accuracy of the circuit. That is, in the high voltage multiplexer to which the floating switch is applied, when switch S is turned on, a current may flow from drive circuit 111 to one end of switch S, thereby affecting the current flowing to output terminal o, which may reduce the accuracy of the high voltage multiplexer. In particular embodiments, when the floating switch is in an on state, no current may flow from its drive circuit to source terminals of transistors in the floating switch, thereby improving the accuracy of the circuit.

In one embodiment, an apparatus can include: (i) a drive circuit for a floating switch having first and second transistors coupled in series, where gate terminals of the first and second transistors are coupled together, and source terminals of the first and second transistors are coupled together; (ii) a control circuit coupled to the gate terminals of the first and second transistors, and being configured to control on and off states of the first and second transistors; and (iii) a clamp circuit configured to clamp gate-source voltages of the first and second transistors to maintain current switching states of the first and second transistors.

Figure 3:
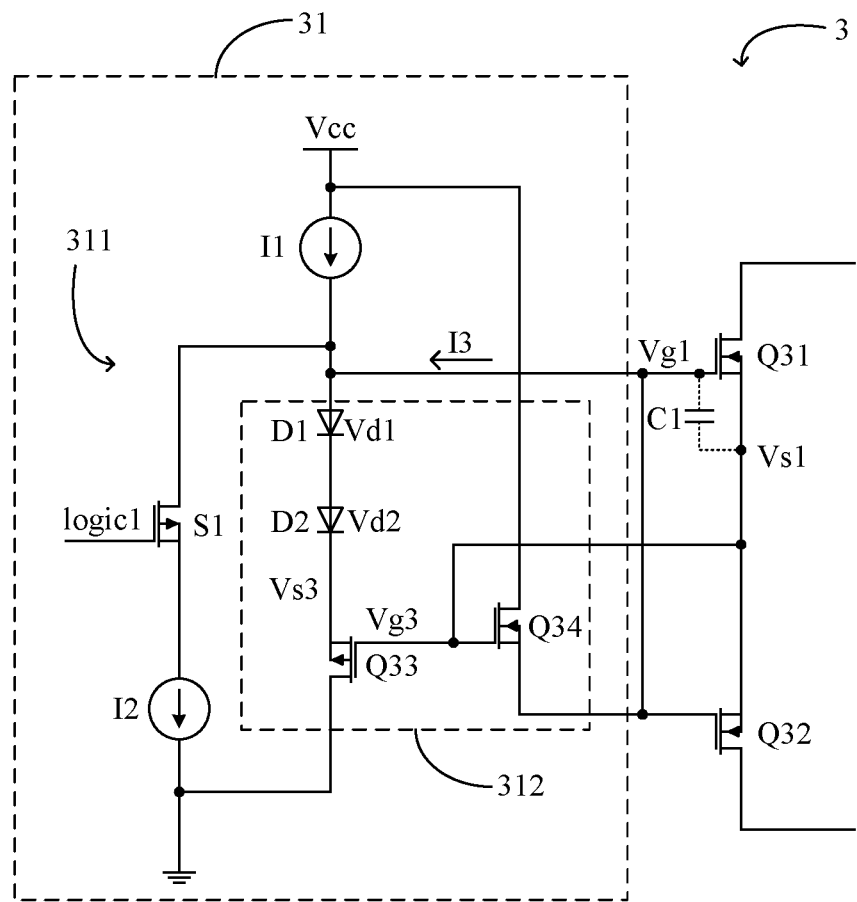
FIG. 3 is a schematic block diagram of a first example floating switch, in accordance with embodiments of the present invention.

Referring now to FIG. 3, shown is a schematic block diagram of a first example floating switch, in accordance with embodiments of the present invention. In this particular example, floating switch 3 can include transistors Q31 and Q32 and drive circuit 31. Similarly, gate terminals of transistors Q31 and Q32 can be commonly connected with each other and source terminals of transistors Q31 and Q32 may be commonly connected with each other. Also, drive circuit 31 can connect to the gate terminals and source terminals of transistors Q31 and Q32, and may generate drive signals for transistors Q31 and Q32 to control on and off states of transistors Q31 and Q32. For example, transistors Q31 and Q32 can be metal-oxide-semiconductor field-effect transistors (MOSFETs) of the same channel type. In particular embodiments, transistors Q31 and Q32 are both N-channel transistors.

Drive circuit 31 can include control circuit 311 and clamp circuit 312. Control circuit 311 can connect to the gate terminals of transistors Q31 and Q32, and may control on and off states of transistors Q31 and Q32 according to logic signal logic1. Clamp circuit 312 can clamp the gate-source voltages of transistors Q31 and Q32 according to logic signal logic1, in order to maintain the current switching states of transistors Q31 and Q32. Also, no current may flow from drive circuit 31 to the source terminals of transistors Q31 and Q32 due to clamp circuit 312.

After logic signal logic1 switches to a first state, transistors Q31 and Q32 can be controlled to be turned on by control circuit 311, and the gate-source voltages of transistors Q31 and Q32 can be clamped to a "first" predetermined value by clamp circuit 312, such that transistors Q31 and Q32 remain in the turn-on states. After logic signal logic1 switches to a second state, transistors Q31 and Q32 can be controlled to be turned off by control circuit 311, and the gate-source voltages of transistors Q31 and Q32 can be clamped to a "second" predetermined value by clamp circuit 312, such that transistors Q31 and Q32 maintain in the turn-off states. It is easy to understand that the first and second predetermined values and can be set according to the conduction conditions of transistors Q31 and Q32.

Control circuit 311 can include current source I1, switch S1, and current source I2 coupled in series between pull-up power supply terminal Vcc and a ground. Current source I1 can connect between pull-up power supply terminal Vcc and the gate terminal of transistor Q31. Switch S1 can connect in series between current sources I1 and I2, and may be controlled to be turned on or off by logic signal logic1. Current source I2 can connect between switch S1 and the ground. In addition, an output current of current source I2 may be greater than an output current of current source I1. In some examples, the output current of current source I2 may be twice the output current of current source I1.

After logic signal logic1 switches to the first state, switch S1 can be controlled to be turned off. Thus, current source I1 can charge parasitic capacitor C1 of transistor Q31, such that the gate-source voltage of transistor Q31 satisfies the conduction condition, and then the transistor Q31 may be turned on. After logic signal logic1 switches to the second state, switch S1 can be controlled to turn on, and the output current of current source I1 may flow to current source I2 through switch S1. Since the output current of current source I2 is greater than the output current of current source I1, current source I2 may also need to draw current I3 from the parasitic capacitor C1 of transistor Q31 (e.g., parasitic capacitor C1 can be discharged) to make the current reach a balance. That is to say, I2=I1+I3 at this time. Thus, the gate-source voltage of transistor Q31 can gradually decrease, such that transistor Q31 can be turned off.

It should be understood that since the gate terminals of transistors Q31 and Q32 are commonly connected with each other, and the source terminals of transistors Q31 and Q32 are commonly connected with each other, the on and off states of transistor Q32 may be consistent with (e.g., the same as) that of transistor Q31. Clamp circuit 312 can include transistor Q33, transistor Q34, and diodes D1 and D2. The channel type of transistor Q33 may be opposite to that of transistor Q31, and the channel type of transistor Q34 can be the same as that of transistor Q31. That is, in some examples, transistor Q33 is a P-channel transistor and transistor Q34 is an N-channel transistor.

In particular embodiments, diodes D1, D2 and transistor Q33 can be sequentially connected in series between the gate terminal of transistor Q31 and the ground. A source terminal of transistor Q33 can connect to a cathode of diode D2, and a drain terminal of transistor Q33 can connect to the ground. Transistor Q34 can connect between pull-up power supply terminal Vcc and the gate terminal of transistor Q32. A drain terminal of transistor Q34 can connect to pull-up power supply terminal Vcc, and a source terminal of transistor Q34 can connect to the gate terminal of transistor Q32. In particular embodiments, gate terminals of transistors Q33 and Q34 can connect with each other, and to the source terminals of transistors Q31 and Q32. Since the gate terminals of the transistors substantially have no current flowing in or out, and the source terminals of transistors Q31 and Q32 can be connected to the gate terminals of transistors Q33 and Q34, when transistors Q31 and Q32 are turned on, substantially no current may flow from drive circuit 31 to the source terminals of transistors Q31 and Q32, such that no current flows to both ends of the floating switch to affect the voltage at both ends. Therefore, the accuracy of the circuit can be improved.

In particular embodiments, diodes D1 and D2 can adjust the clamp voltage of clamp circuit 312, such that the clamp voltage is sufficient to maintain the current switching states of transistors Q31 and Q32. In this particular example, only two diodes are shown, but those skilled in the art will recognize that the number and parameters of diodes in the clamp circuit can be determined according to the conduction condition of transistors Q31 and Q32.

In particular embodiments, after logic signal logic1 switches to the first state, switch S1 can be controlled to be turned off. Then, current source I1 may begin to charge parasitic capacitor C1 of transistor Q31, such that gate voltage Vg1 of transistor Q31 gradually increases, and gate-source voltage Vgs1 also gradually increases. When gate-source voltage Vgs1 of transistor Q31 meets the conduction conditions, transistor Q31 can be controlled to be turned on. In this example, the source terminal of transistor Q33 can be coupled to the gate terminal of transistor Q31 through diodes D1 and D2, and the gate terminal of transistor Q33 can connect coupled to the source terminal of transistor Q31. Therefore, source voltage Vs3 of transistor Q33 may equal Vg1−Vd1−Vd2 (where Vd1 and Vd2 are conduction voltage drops of diodes D1 and D2, respectively), and gate voltage Vg3 of transistor Q33 may be equal to source voltage Vs1 of transistor Q31.

When current source I1 charges parasitic capacitor C1 of transistor Q31, source-gate voltage Vsg3 of transistor Q33 may also gradually increase, such that after transistor Q31 is turned on, source-gate voltage Vsg3 of transistor Q33 can meet its conduction condition and then transistor Q33 may be controlled to be turned on. After transistor Q33 is turned on, gate-source voltage Vgs1 of transistor Q31 can be clamped to Vg1−Vs1. That is, Vgs1=(Vs3−Vg3)+Vd1+Vd2 (e.g., the source-gate voltage of transistor Q33 plus the conduction voltage drops of diodes D1 and D2). Thus, transistor Q31 can continue to be turned on.

When logic signal logic1 is in the second state, switch S1 may be controlled to turn on, and the output current of current source I1 may flow to current source I2 through switch S1. Since the output current of current source I2 is greater than the output current of current source I1, current source I2 may also need to draw current I3 from parasitic capacitor C1 of transistor Q31 (e.g., parasitic capacitor C1 is discharged) to make the current reach a balance. Thus, gate voltage Vg1 of transistor Q31 can begin to decrease to turn off transistor Q31. Since the source terminal of transistor Q34 is connected to the gate terminal of transistor Q31, and the gate terminal of transistor Q34 is connected to the source terminal of transistor Q31, the source voltage of transistor Q34 can gradually decrease, such that the gate-source voltage of transistor Q34 may meet the corresponding conduction condition, and then transistor Q34 can be controlled to be turned on.

After transistor Q34 is turned on, a current loop can be formed from pull-up power supply terminal VCC—transistor Q34—switch S1—current source I2, in order to maintain the current balance. Therefore, current source I2 may no longer draw current from parasitic capacitor C1, such that the gate-source voltage of transistor Q31 may be clamped to a negative value, thereby maintaining the off-state of transistor Q31. It should be understood that since the gate terminals of transistors Q31 and Q32 are commonly connected with each other, and the source terminals of transistors Q31 and Q32 are commonly connected with each other, the on and off states of transistor Q32 may be consistent with that of transistor Q31.

In some examples, transistors Q31 and Q32 can be configured as high voltage transistors, such that the floating switch may have a higher withstand voltage. In this case, the conduction voltages of transistors Q31 and Q32 may be different from that of switch S1. Although switch S1 is a low-voltage switch, since clamp circuit 312 is controlled by the current, and the first and second predetermined values can be adjusted by adjusting the number and parameters of diodes, the drive circuit of the floating switch can control the on and off states of the high-voltage transistors through the low-voltage switch without requiring a level shifter, which can simplify the circuit structure and reduce costs.

In particular embodiments, the switching states of transistors Q31 and Q32 may be controlled according to a logic signal, and the gate-source voltages of transistors Q31 and Q32 can be clamped by a clamp circuit, in order to maintain current switching states of transistors Q31 and Q32 while causing no current to flow from the drive circuit to the source terminals of transistors Q31 and Q32, thereby improving the accuracy of the circuit.

Figure 4:
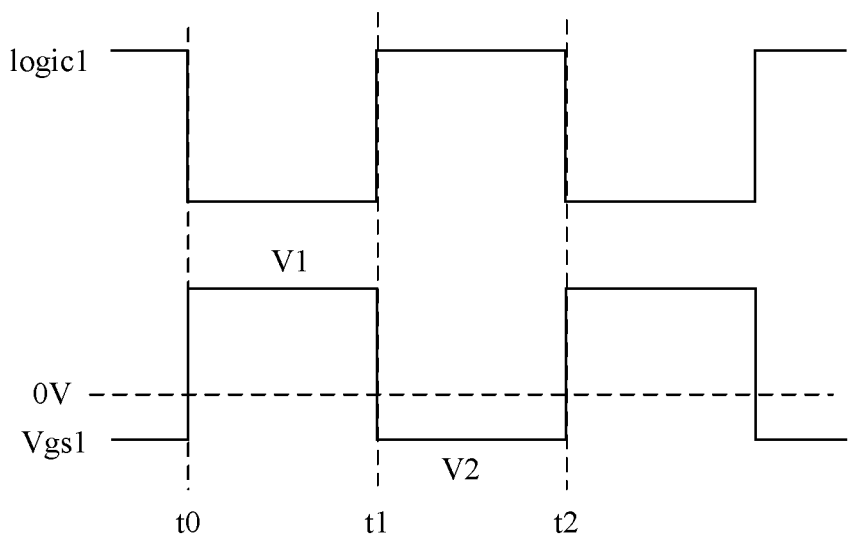
FIG. 4 is a waveform diagram of example operation of the first example floating switch, in accordance with embodiments of the present invention.

Referring now to FIG. 4, shown is a waveform diagram of example operation of the first example floating switch, in accordance with embodiments of the present invention. During time t0-t1, logic signal logic1 is at a low level (e.g., in the first state), switch S1 may remain in the off state, and gate-source voltages of transistor Q31 and transistor Q32 can be clamped at predetermined value V1 by clamp circuit 312. In particular embodiments, transistors Q31 and Q32 are N-channel transistors, such that transistors Q31 and Q32 can be maintained in the on state when the gate-source voltages of transistors Q31 and Q32 are at predetermined value V1. For example, predetermined value V1 may be set according to the conduction conditions of transistors Q31 and Q32.

During time t1-t2, logic signal logic1 is at a high level (e.g., in the second state), switch S1 may remain in the on state, and clamp circuit 312 can clamp the gate-source voltages of transistors Q31 and Q32 at predetermined value V2. Since predetermined value V2 is less than 0, transistors Q31 and Q32 can be maintained in the off state during time t1-t2. Since the source terminals of transistors Q31 and Q32 are connected to the gate terminals of transistors Q33 and Q34 in clamp circuit 312, no current may flow from drive circuit 31 to the source terminals of transistors Q31 and Q32 when transistors Q31 and Q32 are turned on, thereby improving the accuracy of the circuit.

Figure 5:
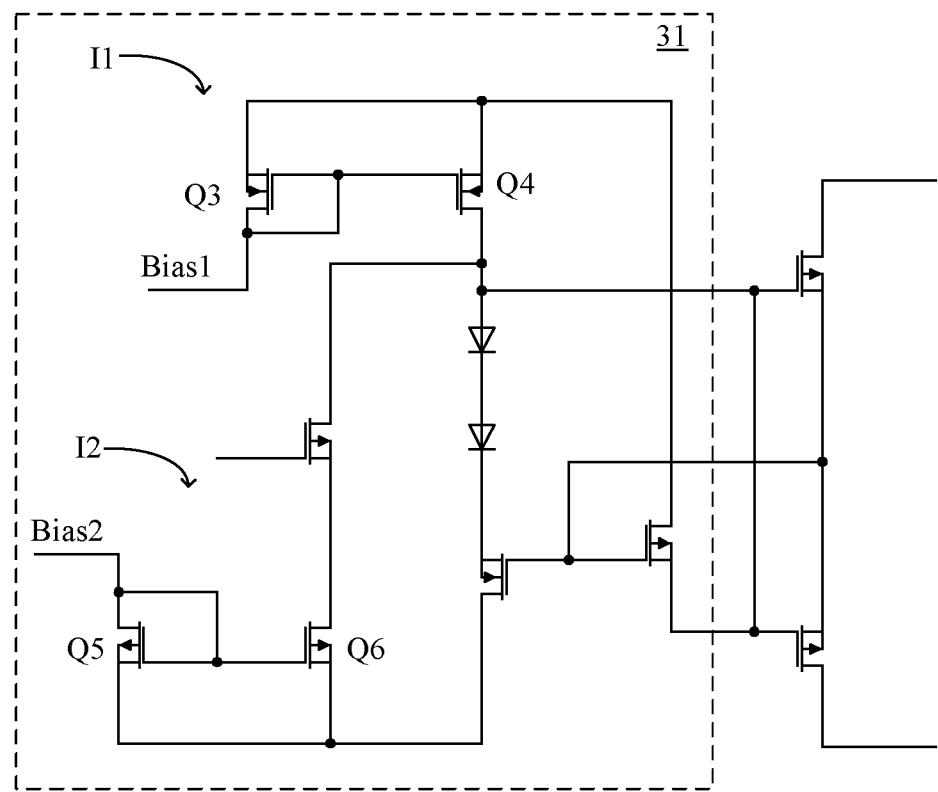
FIG. 5 is a schematic block diagram of an example drive circuit for the first example floating switch, in accordance with embodiments of the present invention.

Referring now to FIG. 5, shown is a schematic block diagram of an example drive circuit for the first example floating switch in accordance with embodiments of the present invention. In this particular example, drive circuit 31 can include current sources I1 and I2. Both current source I1 and current source I2 can be mirror current sources. Current source I1 can include transistors Q3 and Q4. The gate terminals of transistors Q3 and Q4 can be commonly connected with each other and the source terminals of transistors Q3 and Q4 can be commonly connected with each other. That is, current source I1 can be a cascode current mirror. Also, current source I1 may generate an output current according to input bias voltage Bias1. In addition, current source I2 can include transistors Q5 and Q6.

The gate terminals of transistors Q5 and Q6 can be commonly connected with each other and the source terminals of transistors Q5 and Q6 can be commonly connected with each other. That is, current source I2 may also be a cascode current mirror. Also, current source I2 can generate an output current according to input bias voltage Bias2. Therefore, the output current of current source I2 can be greater than the output current of current source I1 by setting the parameters of input bias voltages Bias1 and Bias2. While current sources I1 and I2 are exemplified herein, other circuits capable of realizing the current source function can alternatively be applied in certain embodiments.

Figure 6:
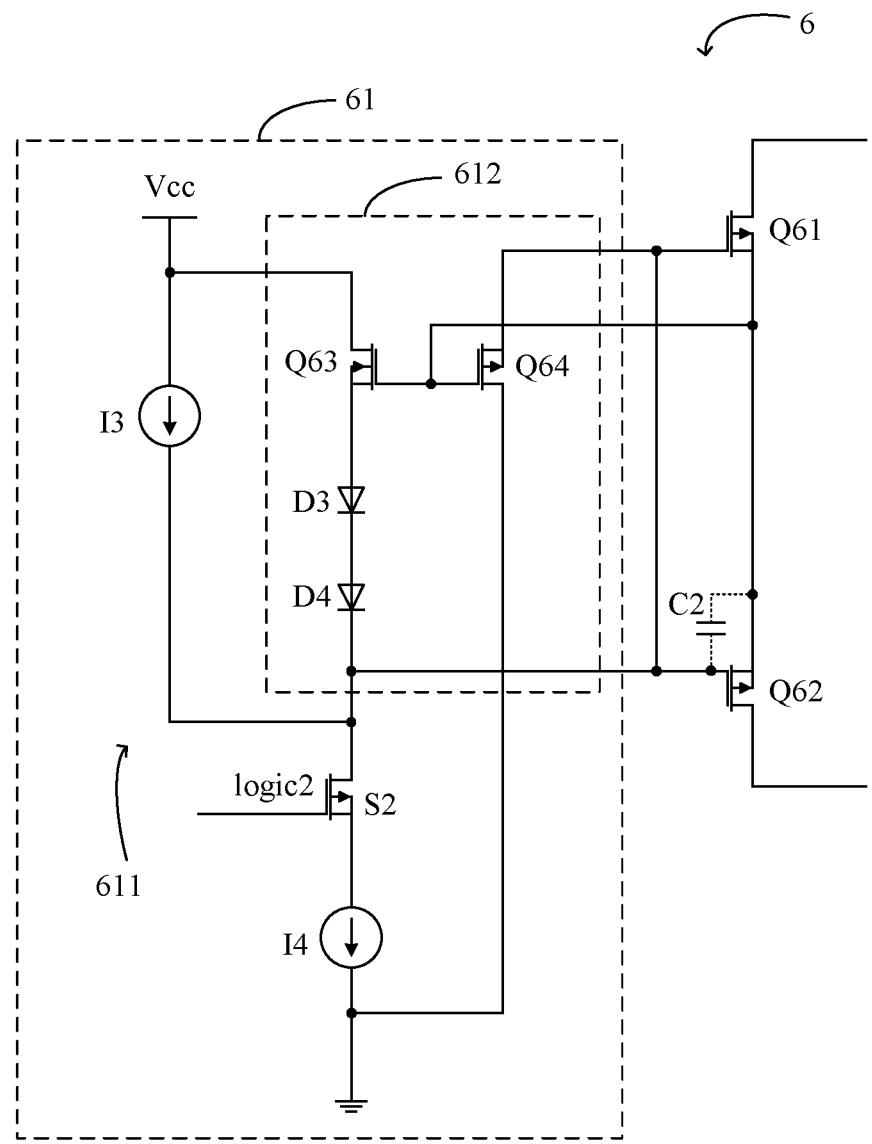
FIG. 6 is a schematic block diagram of a second example floating switch, in accordance with embodiments of the present invention.

Referring now to FIG. 6, shown is a schematic block diagram of a second example floating switch, in accordance with embodiments of the present invention. In this particular example, floating switch 6 can include transistors Q61 and Q62 and drive circuit 61. Gate terminals of transistors Q61 and Q62 can be commonly connected with each other and source terminals of transistors Q61 and Q62 can be commonly connected with each other. Drive circuit 61 can connect to the gate terminals and source terminals of transistors Q61 and Q62, and may generate drive signals to control transistors Q61 and Q62 to be turned on and off. Transistors Q61 and Q62 can be metal-oxide-semiconductor field-effect transistors (MOSFET) of the same channel type. In this particular example, transistors Q61 and Q62 may both be P-channel transistors.

Drive circuit 61 can include control circuit 611 and clamp circuit 612. Control circuit 611 can be coupled to the gate terminals of transistors Q61 and Q62, and may control on and off states of transistors Q61 and Q62 according to logic signal logic2. Clamp circuit 612 can clamp the gate-source voltages of transistors Q61 and Q62 according to logic signal logic2, in order to maintain the current switching states of transistors Q61 and Q62, and no current may flow from drive circuit 61 to the source terminals of transistors Q61 and Q62 due to clamp circuit 612.

After logic signal logic2 switches to the first state, transistors Q61 and Q62 can be controlled to be turned off by control circuit 611. Gate-source voltages of transistors Q61 and Q62 can be clamped to a "first" predetermined value by clamp circuit 612, such that transistors Q61 and Q62 remain in the off states. After logic signal logic2 switches to the second state, transistors Q61 and Q62 can be controlled to be turned on by control circuit 611. The gate-source voltages of transistors Q61 and Q62 can be clamped to a "second" predetermined value by clamp circuit 612, such that transistors Q61 and Q62 remain in the on states. For example, the first and second predetermined values can be set according to the conduction conditions of transistors Q61 and Q62.

Control circuit 611 can include current source I3, switch S2, and current source I4, coupled in series between pull-up power supply terminal Vcc and the ground. In some examples, current sources I3 and I4 can be mirror current sources. Current source I3 can connect between pull-up power supply terminal Vcc and the gate terminal of transistor Q62. Switch S2 can connect between current sources I3 and I4, and may be controlled to be turned on or off by logic signal logic2. Current source I4 can connect between switch S2 and the ground. In addition, an output current of current source I4 may be greater than an output current of current source I3. In some examples, the output current of current source I4 can be twice the output current of current source I3.

After logic signal logic2 switches to the first state, switch S2 may be controlled to be turned off. Then, current source I3 can charge parasitic capacitor C2 of transistor Q62, such that transistor Q62 may be controlled to be turned off. After logic signal logic2 switches to the second state, switch S2 can be controlled to turn on, and the output current of current source I3 may flow to current source I4 through switch S2. Since the output current of current source I4 is greater than the output current of current source I3, current source I4 may also need to draw a current from parasitic capacitor C2 of transistor Q62 (e.g., parasitic capacitor C2 is discharged) to balance the current. Thus, the gate-source voltage of transistor Q62 may gradually decrease to meet the conduction conditions, and then transistor Q62 can be controlled to be turned on. It should be understood that since the gate terminals of transistors Q61 and Q62 are commonly connected with each other, and the source terminals of transistors Q61 and Q62 are commonly connected with each other, the on and off states of transistor Q61 can be consistent with that of transistor Q62.

Clamp circuit 612 can include transistor Q63, transistor Q64, and diodes D3 and D4. The channel type of transistor Q63 may opposite to that of transistor Q61, and the channel type of transistor Q64 can be the same as that of transistor Q61. For example, transistor Q63 is an N-channel transistor, and transistor Q64 is a P-channel transistor. Transistor Q63, diodes D3 and D4 can be sequentially coupled in series between pull-up power supply terminal Vcc and the gate terminal of transistor Q62. A source terminal of transistor Q63 can connect to the anode of diode D3, and a drain terminal of transistor Q63 can connect to pull-up power supply terminal Vcc. Transistor Q64 can connect between the ground and the gate terminal of transistor Q61. A drain terminal of transistor Q64 can connect to the ground, and a source terminal of transistor Q64 can connect to the gate terminal of transistor Q61.

Also, gate terminals of transistors Q63 and Q64 may be commonly connected with each other, and can connect to the source terminals of transistors Q61 and Q62. Since the gate terminals of the transistors have substantially no current flowing in or out, and the source terminals of transistors Q61 and Q62 are connected to the gate terminals of the transistors Q63 and Q64, when transistors Q61 and Q62 are turned on, substantially no current may flow from drive circuit 61 to the source terminals of transistors Q61 and Q62, such that no current may flow to both ends of the floating switch to affect the voltage at both ends. Thus, the accuracy of the circuit can be improved. In particular embodiments, diodes D3 and D4 can adjust the clamp voltage of clamp circuit 612, such that the clamp voltage is sufficient to control transistors Q61 and Q62 to be turned on. While two diodes are exemplified herein, those skilled in the art will recognize that the number and parameters of diodes in clamp circuit 612 can be adjusted according to the conduction conditions of transistors Q61 and Q62.

After logic signal logic2 switches to the first state, switch S2 can be controlled to be turned off. Then, current source I3 may begin to charge parasitic capacitor C2 of transistor Q62, and the gate voltage of transistor Q62 can gradually increase, such that transistor Q62 may be controlled to be turned off. For example, the source terminal of transistor Q64 can connect to the gate terminal of transistor Q62, the gate terminal of transistor Q64 can connect to the source terminal of transistor 62, and the channel type of transistor Q64 may be the same as that of transistor Q62. Therefore, when current source I3 starts to charge parasitic capacitor C2 of transistor Q62, the source voltage of transistor Q64 may gradually increase, such that after transistor Q62 is turned off, the source-gate voltage of transistor Q64 meets the conduction condition, and transistor Q64 is controlled to be turned on. After transistor Q64 is turned on, the source-gate voltage of transistor Q62 can be clamped to a greater positive value, such that transistor Q64 can maintain in an off state.

After logic signal logic2 switches to the second state, switch S2 may be controlled to be turned on, and the output current of current source I3 can flow to current source I4 through switch S2. Since the output current of current source I4 is greater than the output current of current source I3, current source I4 may also need to draw a current from parasitic capacitor C2 of transistor Q62 (e.g., parasitic capacitor C2 is discharged) to balance the current. Thus, the gate voltage of transistor Q62 may gradually be reduced, such that the source-gate voltage of transistor Q62 satisfies the conduction condition, and then transistor Q62 can be controlled to be turned on. Since the source terminal of transistor Q63 is coupled to the gate terminal of transistor Q62 through diodes D3 and D4 and the gate terminal of transistor Q63 is connected to the source terminal of transistor Q62, when the gate voltage of transistor Q62 decreases, the source voltage of transistor Q63 can accordingly decrease.

Therefore, after transistor Q62 is turned on, the gate-source voltage of transistor Q63 may meet the conduction condition and transistor Q63 can be controlled to be turned on. After transistor Q63 is turned on, a current loop of pull-up power supply terminal Vcc—transistor Q63—diode D3—diode D4—switch S2—current source I4 may be formed to maintain current balance. Therefore, current source I4 may no longer draw current from parasitic capacitor C2, such that the source-gate voltage of transistor Q62 is clamped to a negative value, thereby maintaining the on-state of transistor Q62. It should be understood that since the gate terminals of transistors Q61 and Q62 are commonly connected with each other, and the source terminals of transistors Q61 and Q62 are commonly connected with each other, the on and off states of transistor Q61 may be consistent with that of transistor Q62.

In some embodiments, transistors Q61 and Q62 can be configured as high voltage transistors, such that the floating switch can have a higher withstand voltage. In this case, the conduction voltages of transistors Q61 and Q62 may be different from that of switch S2. Although switch S2 is a low-voltage switch, since clamp circuit 612 is controlled by current, and the predetermined values can be adjusted by adjusting the number and parameters of diodes, the drive circuit of the floating switch can realize the function of controlling the on and off states of the high-voltage transistors through the low-voltage switch without requiring a level shifter, which can simplify the circuit structure and reduce costs.

In particular embodiments, the switching states of transistors Q61 and Q62 may be controlled according to a logic signal, and the gate-source voltages of transistors Q61 and Q62 can be clamped by a clamp circuit, in order to maintain current switching states of transistors Q61 and Q62 while causing no current to flow from the drive circuit to the source terminals of transistors Q61 and Q62, thereby improving the accuracy of the circuit.

Figure 7:
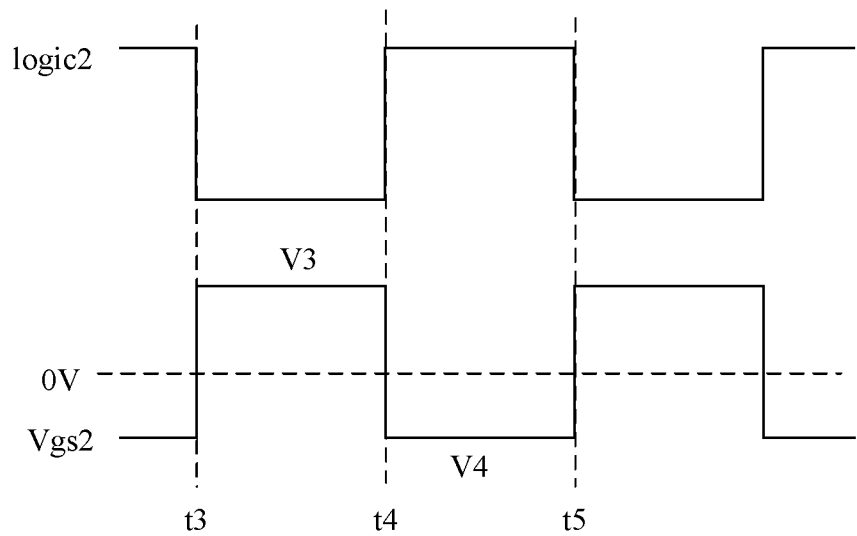
FIG. 7 is a waveform diagram of example operation of the second example floating switch, in accordance with embodiments of the present invention.

Referring now to FIG. 7, shown is a waveform diagram of example operation of the second example floating switch, in accordance with embodiments of the present invention. In this particular example, during time t3-t4, logic signal logic2 is at a low level (e.g., in the first state), switch S2 remains in the off state, and the gate-source voltage of transistors Q61 and Q62 can be clamped at predetermined value V3 by clamp circuit 612. For example, transistors Q61 and Q62 are P-channel transistors, such that transistors Q61 and Q62 can be maintained in the off state when the gate-source voltage of transistors Q61 and Q62 are predetermined value V3. For example, predetermined value V3 can be set according to the conduction conditions of transistors Q61 and Q62.

During time t4-t5, logic signal logic2 is at a high level (e.g., in the second state), switch S2 remains on, and clamp circuit 612 can clamp gate-source voltage Vgs2 of transistors Q61 and Q62 at predetermined value V4. Since predetermined value V4 is less than 0, transistors Q61 and Q62 can be maintained in the on states during time t4-t5. Since the source terminals of transistors Q61 and Q62 are connected to the gate terminals of transistors Q63 and Q64 in clamp circuit 612, when transistors Q61 and Q62 are turned on, no current may flow from drive circuit 61 to the source terminals of transistors Q61 and Q62, thereby improving the accuracy of the circuit.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. An apparatus, comprising:
   a) a drive circuit for a floating switch having first and second transistors coupled in series, wherein gate terminals of the first and second transistors are coupled together, and source terminals of the first and second transistors are coupled together at a common source node;
   b) a control circuit coupled to the gate terminals of the first and second transistors, and being configured to control on and off states of the first and second transistors; and
   c) a clamp circuit configured to clamp gate-source voltages of the first and second transistors to maintain current switching states of the first and second transistors,
   d) wherein the clamp circuit comprises third and fourth transistors having gate terminals thereof coupled together to the common source node, such that no current flows from the drive circuit to the common source node due to the clamp circuit.

2. The apparatus of claim 1, wherein no current flows from the drive circuit to the common source node when the first and second transistors are turned on.

3. The apparatus of claim 1, wherein the gate terminals of the third and fourth transistors are directly connected to the common source node.

4. The apparatus of claim 1, wherein a source terminal of the third transistor is coupled to the gate terminal of the first transistor through at least one diode, and a source terminal of the fourth transistor is coupled to the gate terminal of the first transistor.

5. The apparatus of claim 1, wherein channel types of the first, second, and fourth transistors are the same, and a channel type of the third transistor is different from the channel types of the first, second, and fourth transistors.

6. The apparatus of claim 1, wherein:
   a) the gate-source voltage of the first and second transistors is clamped to a first predetermined value when a logic signal is in a first state; and
   b) the gate-source voltage of the first and second transistors is clamped to a second predetermined value when the logic signal is in a second state.

7. The apparatus of claim 1, wherein the control circuit comprises:
   a) a first current source coupled between a pull-up power supply terminal and the gate terminal of the first transistor;
   b) a second current source coupled between the gate terminal of the first transistor and a ground, wherein an output current of the second current source is greater than an output current of the first current source; and
   c) a switch coupled between the first and second current sources, and being controlled to be turned on and off by a logic signal.

8. The apparatus of claim 1, wherein the clamp circuit further comprises at least one diode coupled in series between the gate terminal of the first transistor and a source terminal of the third transistor in a forward direction.

9. The apparatus of claim 6, wherein when the first and second transistors are N-channel transistors, the first predetermined value is set to maintain on states of the first and second transistors, and the second predetermined value is set to maintain off states of the first and second transistors.

10. The apparatus of claim 1, wherein when the first and second transistors are N-channel transistors, a drain terminal of the third transistor is coupled to a ground and a drain terminal of the fourth transistor is coupled to a pull-up power supply terminal.

11. The apparatus of claim 6, wherein when the first and second transistors are P-channel transistors, the first predetermined value is set to maintain the off state of the first and second transistors, and the second predetermined value is set to maintain the on state of the first and second transistors.

12. The apparatus of claim 1, wherein when the first and second transistors are P-channel transistors, a drain terminal of the third transistor is coupled to a pull-up power supply terminal and a drain terminal of the fourth transistor is coupled to a ground.

13. The apparatus of claim 1, wherein the first and second transistors are high voltage transistors.

14. The apparatus of claim 7, wherein the switch is low voltage transistor.

15. The apparatus of claim 1, wherein the third and fourth transistors are low voltage transistors.

\* \* \* \* \*